(12) United States Patent
Behziz et al.

(10) Patent No.: US 8,696,378 B2
(45) Date of Patent: Apr. 15, 2014

(54) ELECTRICAL CONNECTOR ASSEMBLY AND PRINTED CIRCUIT BOARD CONFIGURED TO ELECTRICALLY COUPLE TO A COMMUNICATION CABLE

(75) Inventors: Arash Behziz, Newbury Park, CA (US); Dustin Grant Rowe, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 99 days.

(21) Appl. No.: 13/404,862

(22) Filed: Feb. 24, 2012

(65) Prior Publication Data

US 2013/0225004 A1    Aug. 29, 2013

(51) Int. Cl.
*H01R 12/24*       (2006.01)
(52) U.S. Cl.
USPC .......................................................... 439/497
(58) Field of Classification Search
USPC .......................................... 439/497, 579, 487
See application file for complete search history.

(56) References Cited

U.S. PATENT DOCUMENTS

| | | | |
|---|---|---|---|
| 4,116,516 A * | 9/1978 | Griffin | 439/67 |
| 4,784,613 A | 11/1988 | Deisch | |
| 5,261,826 A * | 11/1993 | Leeb et al. | 439/67 |
| 5,808,529 A * | 9/1998 | Hamre | 333/246 |

* cited by examiner

*Primary Examiner* — Phuong Dinh

(57) ABSTRACT

An electrical connector assembly including a printed circuit board that has base and cover layers of dielectric material and first and second ground planes of conductive material. The base and cover layers are stacked relative to each other and located between the first and second ground planes. The base layer has a conductor-receiving portion that extends beyond the cover layer. The circuit board also includes signal traces that are exposed to an open space that exists above the conductor-receiving portion. The connector assembly also includes a compression component that is configured to be positioned in the open space to press wire-terminating ends of signal conductors onto the signal traces at the conductor-receiving portion.

20 Claims, 5 Drawing Sheets

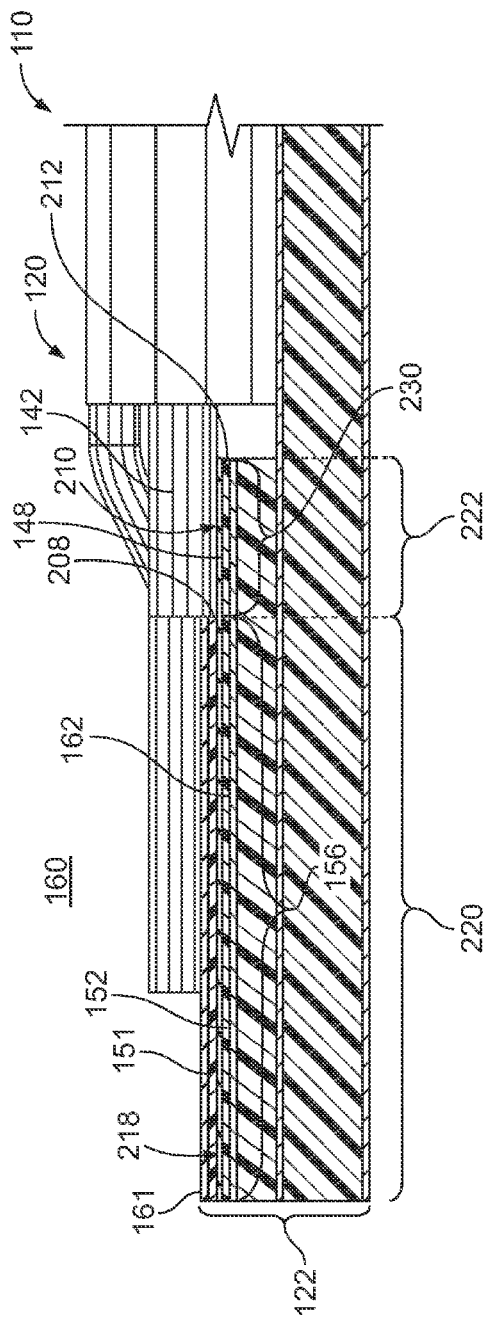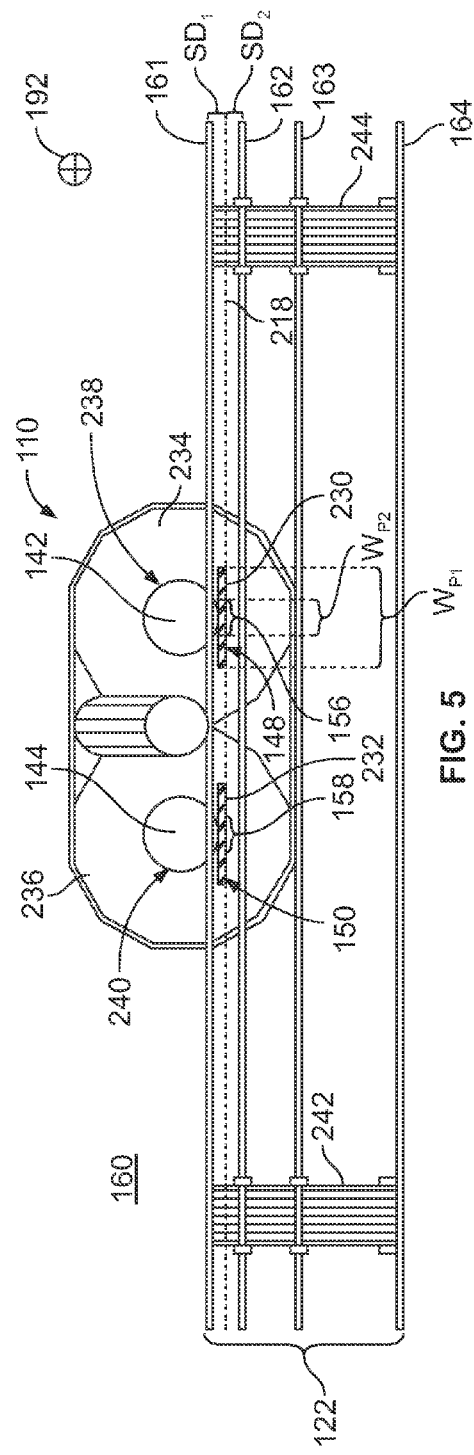

ELECTRICAL CONNECTOR ASSEMBLY AND PRINTED CIRCUIT BOARD CONFIGURED TO ELECTRICALLY COUPLE TO A COMMUNICATION CABLE

BACKGROUND OF THE INVENTION

The subject matter described and/or illustrated herein relates generally to an electrical connector assembly and/or printed circuit board that electrically couples to signal conductors of a communication cable.

In some electrical connector assemblies, signal conductors from communication cables are terminated to an electrical connector by directly joining exposed wire-terminating ends of the signal conductors to corresponding conductive elements. For example, a wire-terminating end can be soldered directly to a corresponding conductive pad along a surface of a circuit board. To solder the two elements together, a solder paste is applied to the wire-terminating end and/or the conductive pad. The solder paste is then melted and cooled to directly join the wire-terminating end and the conductive pad. An electrical connection is established through this termination.

However, using a soldering process to join two elements at a termination can be undesirable. First, it can be difficult to control the different variables of the soldering process so that the wire-terminating ends and the conductive pads are consistently joined and so that a desired electrical performance is achieved. For instance, the soldering process typically uses large amounts of heat to melt the solder paste. Heating (directly or indirectly) the circuit board and/or the wire-terminating ends increases the likelihood of damage to the circuit board and/or the wire-terminating ends. Second, if several terminations are desired, the conductive pads are typically spaced apart so that the solder paste at one termination does not inadvertently join the solder paste at another termination. Yet increasing the space between the conductive pads may limit the number of possible terminations. Lastly, a soldered joint is generally permanent and is not readily fixable without desoldering and then re-soldering the two elements.

Accordingly, there is a need for an electrical connector assembly having a printed circuit board that is capable of electrically coupling to a communication cable without using a soldering process.

BRIEF DESCRIPTION OF THE INVENTION

In one embodiment, an electrical connector assembly is provided that includes a printed circuit board that has base and cover layers of dielectric material and first and second ground planes of conductive material. The base and cover layers are stacked relative to each other and located between the first and second ground planes. The base layer has a conductor-receiving portion that extends beyond the cover layer. The circuit board also includes signal traces that are exposed to an open space that exists above the conductor-receiving portion. The connector assembly also includes a compression component that is configured to be positioned in the open space to press wire-terminating ends of signal conductors onto the signal traces at the conductor-receiving portion.

In another embodiment, an electrical connector assembly is provided that includes a printed circuit board that has base and cover layers of dielectric material and first and second ground planes of conductive material. The base and cover layers are stacked relative to each other and located between the first and second ground planes. The base layer has a conductor-receiving portion that extends beyond the cover layer. The circuit board also includes signal traces that are exposed to an open space that exists above the conductor-receiving portion. The connector assembly also includes a communication cable having signal conductors with wire-terminating ends. The connector assembly also includes a compression component that is configured to be positioned in the open space to press the wire-terminating ends of the signal conductors onto the signal traces at the conductor-receiving portion.

Optionally, the connector assembly may include a module housing having a housing cavity. The circuit board can be located at least partially in the housing cavity. In such embodiments, the circuit board, the compression component, and the module housing may form a pluggable electronic module that has a mating end and a cable end with the conductor-receiving portion being located proximate to the cable end.

In yet another embodiment, a printed circuit board configured to directly couple to signal conductors of a communication cable is provided. The circuit board includes a dielectric base layer having a body portion, a conductor-receiving portion, and a layer surface that extends along the body and conductor-receiving portions. The conductor-receiving portion has a base edge. The circuit board also includes a dielectric cover layer having a cover edge. The cover layer is stacked onto the layer surface of the body portion. The conductor-receiving portion of the base layer extends beyond the cover edge to the base edge. The circuit board also includes first and second ground planes spaced apart from each other with the base and cover layers located therebetween. The circuit board also includes signal traces extending along the layer surface of the conductor-receiving portion from the cover edge toward the base edge. The signal traces are exposed along the layer surface of the conductor-receiving portion to directly couple with the signal conductors of the communication cable.

BRIEF DESCRIPTION OF THE DRAWINGS

FIG. 4 illustrates a side view of the connector assembly shown in FIG. 2.

FIG. 5 is a front view of a communication cable engaged to the connector assembly of FIG. 2.

DETAILED DESCRIPTION OF THE INVENTION

Figure 1:
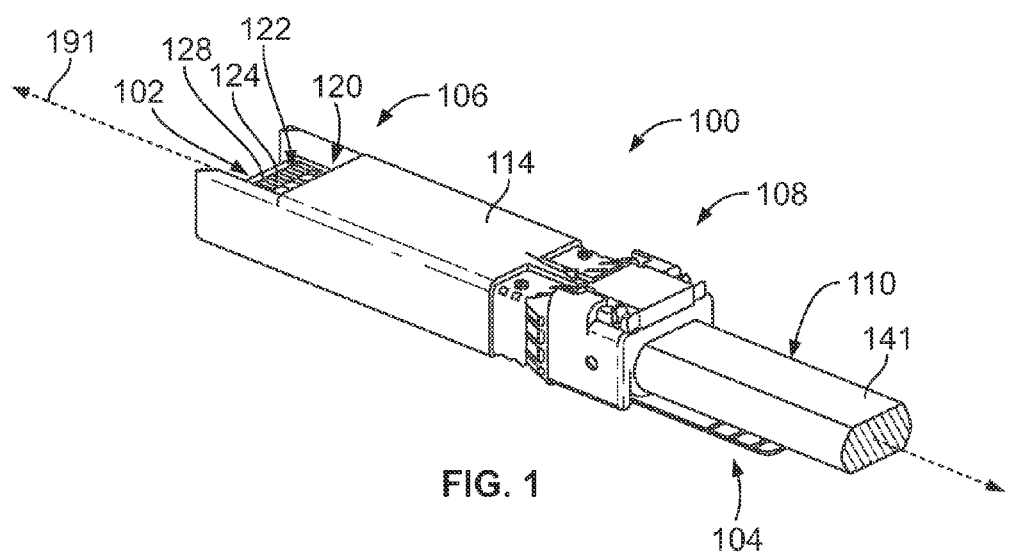
FIG. 1 is a perspective view of a pluggable electronic module formed in accordance with one embodiment.

FIG. 1 is a perspective view of a pluggable electronic module 100 formed in accordance with one embodiment. The electronic module 100 has a mating end 102, a loading end 104, and a central axis 191 extending therebetween. The electronic module 100 includes a module housing 114 having a housing cavity 126 (shown in FIG. 2) configured to hold an electrical connector assembly 120 as described herein. Also shown, the electronic module 100 includes a plug portion 106 at the mating end 102 and a cable portion 108 at the loading end 104. The plug portion 106 is configured to be inserted into a receptacle (not shown) of a communication system (not shown). The cable portion 108 is configured to couple to a communication cable 110 having an insulative jacket 141.

The connector assembly 120 includes a printed circuit board 122 that has terminal contacts 124 located at a terminal end 128 of the circuit board 122, which is proximate to the mating end 102 of the electronic module 100. In an exemplary embodiment, the terminal end 128 is configured to mate with an electrical connector (not shown) of the receptacle and establish a communicative connection through the terminal contacts 124. However, in alternative embodiments, the circuit board 122 may not directly couple to another electrical component. For example, the circuit board 122 may be an internal component of the electronic module 100 that is communicatively coupled to mating contacts. In such embodiments, the mating contacts may directly couple to the electrical connector of the receptacle.

In an exemplary embodiment, the electronic module 100 is a small form-factor pluggable (SFP) transceiver that includes the connector assembly 120 as described herein. However, in alternative embodiments, the electronic module 100 may be other types of pluggable components. Furthermore, in alternative embodiments, the connector assembly 120 is not held by the module housing 114 and may be used in other communication systems or devices. For example, the connector assembly 120 may be used to analyze an electrical performance of a communication cable.

Figure 2:
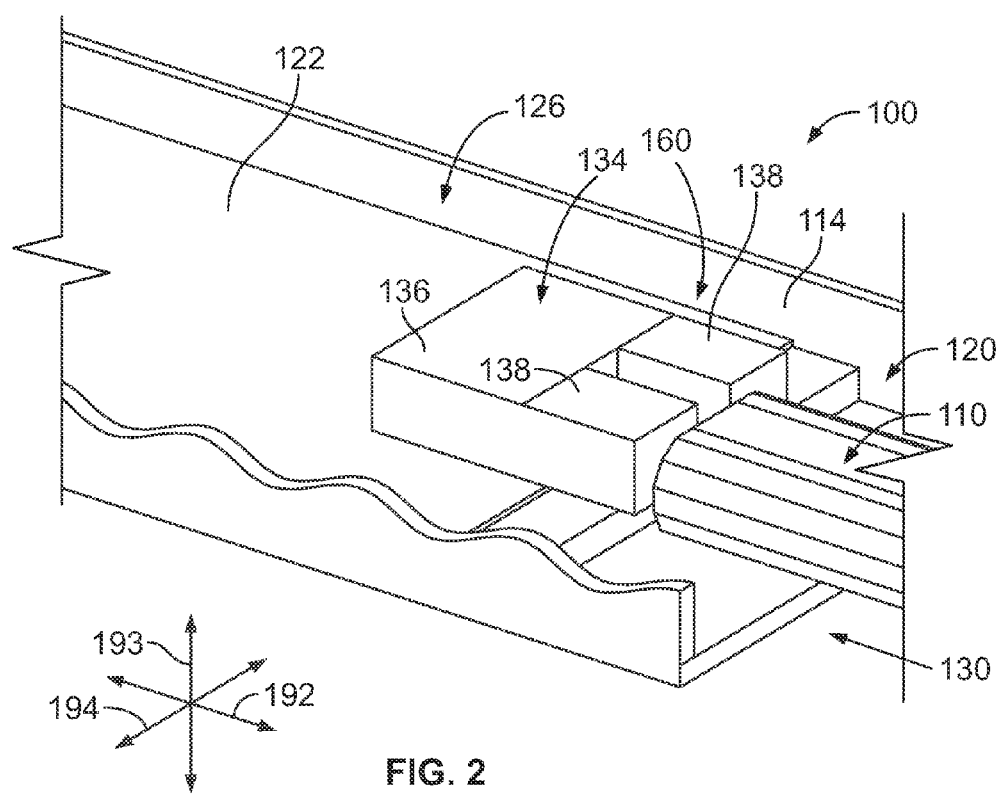
FIG. 2 is a perspective view of an exposed portion of the electronic module showing an electrical connector assembly formed in accordance with one embodiment.

FIG. 2 is a perspective view of an exposed portion of the electronic module 100 showing the connector assembly 120 in greater detail. The electronic module 100 is oriented with respect to mutually perpendicular axes including a longitudinal axis 192 and orientation axes 193, 194. The longitudinal axis 192 extends parallel to the central axis 191 (FIG. 1). The connector assembly 120 may include the circuit board 122, a compression component 134, and, optionally, the cable 110. The circuit board 122 extends between a cable end 130 and the terminal end 128 (FIG. 1). The module housing 114 defines the housing cavity 126 and is configured to hold at least a portion of the connector assembly 120 and/or the circuit board 122. In the illustrated embodiment, the circuit board 122 has a longest dimension that extends parallel to the longitudinal axis 192. However, the circuit board 122 may have other dimensions and shapes in other embodiments. For example, a longest dimension of the circuit board 122 may extend perpendicular to the longitudinal axis 192 along one of the orientation axes 193, 194.

As shown in FIG. 2, an open space 160 may exist above at least a portion of the circuit board 122 so that one or more components may be permitted to directly engage the circuit board 122 through the open space 160. For example, as will be described in greater detail below, the compression component 134 is configured to press conductors and/or a drain wire of the cable 110 toward the circuit board 122 to facilitate establishment of an electrical connection. In the illustrated embodiment, the compression component 134 includes a pair of leg elements 138 and a bridge element 136 that joins the leg elements 138.

Figure 3:
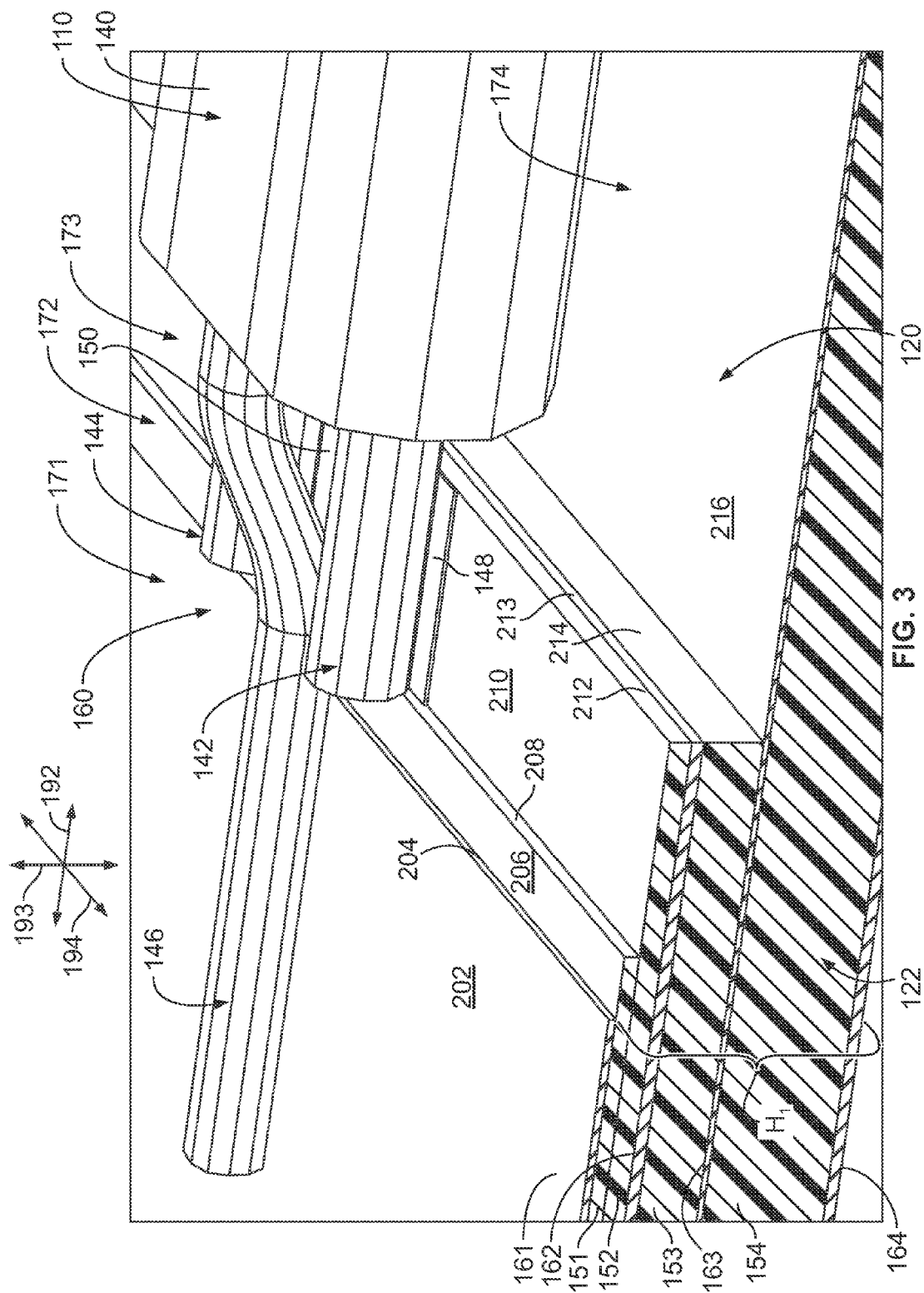
FIG. 3 is a perspective view of a portion of the connector assembly shown in FIG. 2.

FIG. 3 is a perspective view of a portion of the connector assembly 120. In an exemplary embodiment, the cable 110 includes a conductive shielding 140 that surrounds a pair of signal conductors 142, 144 and a drain wire 146. The cable 110 also includes the insulative jacket 141 (FIG. 1) that surrounds the shielding 140. In FIG. 3, the jacket 141 has been removed. The signal conductors 142, 144 and the drain wire 146 may have a "parallel pair" construction in which the signal conductors 142, 144 extend substantially parallel to each other along a length of the cable 110 with the drain wire 146 extending within a gap or recess that exists between the signal conductors 142, 144. However, embodiments described herein may also be suitable with other cable constructions. For example, in alternative embodiments, the cable 110 may be a twisted-pair cable in which a pair of signal conductors are twisted about each other and extend along a length of the cable 110 with a drain wire. As another example, the cable 110 may include two drain wires that extend parallel to each other and a parallel pair of signal conductors that extend between the two drain wires. Yet still in other embodiments, the cable 110 does not include a drain wire.

As shown in FIG. 3, the circuit board 122 includes a plurality of substrate layers 151-154 and a plurality of ground planes 161-164. The circuit board 122 may have a height $H_1$ measured along the orientation axis 193. The substrate layers 151-154 and the ground planes 161-164 are stacked with respect to each other along the orientation axis 193 such that the different substrate layers 151-154 and the ground planes 161-164 have different heights. The circuit board 122 also includes signal traces 148, 150 that extend along the substrate layer 152 and between the substrate layers 151, 152. The substrate layer 151 may be referred to as the cover layer 151, and the substrate layer 152 may be referred to as the base layer 152. The ground planes 161-164 may be referred to as, respectively, the first, second, third, and fourth ground planes 161-164.

As used herein a "substrate layer" may include multiple substrate layers (i.e., sub-layers). A substrate layer includes a dielectric material (e.g., FR-4), but may have additional features other than the dielectric material. For instance, a substrate layer may include conductive vias and/or traces that extend along or through select portions of the substrate layer. As used herein the term "ground plane" includes a layer of conductive material (e.g., copper) that extends along one or more substrate layers.

In an exemplary embodiment, the first and second ground planes 161, 162 may be separated from the signal traces 148, 150 by the cover and base layers 151, 152, respectively. The first and second ground planes 161, 162 may substantially appear as infinite ground potentials to most signals transmitting through the signal traces 148, 150. In the illustrated embodiment, the ground planes 161-164 extend along an entire width of the circuit board 122 measured along the orientation axis 194. However, in other embodiments, the ground planes 161-164 do not extend along the entire width. In such embodiments, the first and second ground planes 161, 162 may still substantially appear as infinite ground potentials to the signal traces 148, 150. In some embodiments, the first and second ground planes 161, 162, the cover and base layers 151, 152, and the signal traces 148, 150 may have a configuration that effectively operates as a stripline transmission line.

In an exemplary embodiment, the substrate layers 151-154 and/or the ground planes 161-164 are dimensioned with respect to each other to form a plurality of platform steps (or levels) 171-174. As shown in FIG. 3, the first ground plane 161 has a ground surface 202 and a plane edge 204; the cover layer 151 has a layer surface 206 and a cover edge 208; the base layer 152 has a layer surface 210 and a base edge 212; the ground plane 162 has a plane edge 213 that is flush or even with the base edge 212; the substrate layer 153 has a layer edge 214 that is flush or even with the base edge 212 and the plane edge 213; and the third ground plane 163 has a ground surface 216 and a plane edge (not shown). The plane edge 204, the cover edge 208, and the base edge 212 have different axial locations with respect to the longitudinal axis 192. For example, the cover layer 151 clears the plane edge 204 and extends to the cover edge 208 in a direction along the longitudinal axis 192. The base layer 152 clears the cover edge 208 and extends to the base edge 212 in the same direction. The third ground plane 163 extends beyond the base edge 212. As such, each one of the layer surfaces 206, 210 has an area that is exposed to the open space 160. Also shown, each one of the ground surfaces 202, 216 has an area that is exposed to the open space 160. Accordingly, the platform step 171 includes an exposed area of the ground surface 202, the platform step 172 includes an exposed area of the layer surface 206, the platform step 173 includes an exposed area of the layer surface 210, and the platform step 174 includes an exposed area of the ground surface 216.

The platform steps 171-174 and the open space 160 permit the cable 110 to directly couple to different conductive elements of the circuit board 122. More specifically, the platform steps 171-174 have different heights along the orientation axis 193 that allow the platform steps 171-174 to directly couple to different conductive elements of the cable 110. For example, the platform step 174 may support the shielding 140 of the cable 110 when coupled to the circuit board 122. Since the platform step 174 is formed in part by the third ground plane 163, the shielding 140 is also electrically coupled to the circuit board 122. The platform steps 174 and 173 are dimensioned so that the signal conductors 142, 144 may couple to the corresponding signal traces 148, 150 when the shielding 140 is placed on the platform step 174. Moreover, the platform steps 171-173 are dimensioned so that that drain wire 146 may couple to the first ground plane 161. Thus, embodiments described herein can be configured to establish multiple electrical connections between the cable 110 and the circuit board 122 at different levels along the height $H_1$.

The compression component 134 (FIG. 2) is configured to hold the different conductive elements of the cable 110 in electrical contact with different conductive elements of the circuit board 122. In an exemplary embodiment, the compression component 134 presses the drain wire 146 against the ground plane 161 and the signal conductors 142, 144 against the signal traces 148, 150. In some embodiments, the compression component 134 may also press the shielding 140 against the ground plane 163. In FIG. 2, the compression component 134 is illustrated as a single block of material that engages the signal conductors 142, 144. However, the compression component 134 may take various forms that engage and press the signal conductors 142, 144 and/or the drain wire 146 onto the corresponding surfaces of the circuit board 122. For example, the compression component 134 may include separate features in which each feature individually engages the corresponding signal conductor 142, 144 or drain wire 146. Various mechanisms may be used to press the compression component 134 against the signal conductors 142, 144 and/or the drain wire 146, such as a lever mechanism.

FIG. 4 is a side view of the connector assembly 120 illustrating the circuit board 122 in greater detail. As shown, the cover and base layers 151, 152 are stacked with respect to each other and have an interface 218 extending therebetween. The first and second ground planes 161, 162 are spaced apart from each other and have the cover and base layers 151, 152 located therebetween. The base layer 152 has a body portion 220 and a conductor-receiving portion 222. The layer surface 210 extends along the body and conductor-receiving portions 220, 222. The cover layer 151 is stacked onto the layer surface 210 of the body portion 220, and the conductor-receiving portion 222 projects beyond the cover layer 151 to the base edge 212.

In the illustrated embodiment, the signal traces 148, 150 extend along the layer surface 210 through the interface 218 and onto the conductor-receiving portion 222. (The signal trace 150 is shown in FIG. 3.) The signal traces 148, 150 clear the cover edge 208 and extend from the cover edge 208 toward the base edge 212. The signal traces 148, 150 are exposed along the layer surface 210 of the conductor-receiving portion 222 so that the signal traces 148, 150 can directly couple to the signal conductors 142, 144 (FIG. 3) of the cable 110.

With reference to FIGS. 4 and 5, the signal traces 148, 150 (FIG. 5) include terminal pads 230, 232 (FIG. 5), respectively, that are exposed to the open space 160 along the conductor-receiving portion 222 (FIG. 4). The signal traces 148, 150 also include path portions 156, 158 (FIG. 5), respectively, that extend between the cover layer 151 (FIG. 4) and the base layer 152 (FIG. 4) along the interface 218. The dimensions of the terminal pads 230, 232 may also be configured to control impedance. For example, as shown in FIG. 5, the terminal pads 230, 232 have a width $W_{P1}$ and the path portions 156, 158 have a width $W_{P2}$. The width $W_{P1}$ is greater than the width $W_{P2}$. Accordingly, in some embodiments, the terminal pad 230 and the path portion 156 have differently sized cross-sections taken perpendicular to the longitudinal axis 192. The terminal pad 232 and the path portion 158 may also have differently sized cross-sections.

FIG. 5 is a view along the longitudinal axis 192 when the cable 110 is coupled to the circuit board 122. For illustrative purposes, the substrate layers 151-154 (FIG. 3) are not shown in FIG. 5. In various embodiments, the circuit board 122 is dimensioned to control impedance. For example, the first ground plane 161 is separated from the signal traces 148, 150 by a separation distance $SD_1$. The separation distance $SD_1$ may correspond to a thickness of the cover layer 151 (FIG. 3). The second ground plane 162 is separated from the signal traces 148, 150 by a separation distance $SD_2$. The separation distance $SD_2$ may correspond to a thickness of the base layer 152 (FIG. 3). The separation distances $SD_1$, $SD_2$ may be configured to obtain a desired impedance (e.g., 100 Ohms). For example, as the separation distance $SD_1$ increases, the electromagnetic coupling between the first ground plane 161 and the signal traces 148, 150 decreases and the impedance increases. As the separation distance $SD_1$ decreases, the electromagnetic coupling between the first ground plane 161 and the signal traces 148, 150 increases and the impedance decreases. In the illustrated embodiment, the separation distance $SD_1$ is less than the separation distance $SD_2$. However, in other embodiments, the separation distances $SD_1$, $SD_2$ may be substantially equal to each other or the separation distance $SD_2$ may be less than the separation distance $SD_1$.

The circuit board 122 may have other qualities or characteristics that can be modified to control impedance. For example, the dielectric material of the substrate layers 151-154 (FIG. 3) can be selected for a desired impedance. The dielectric material may be the same or different for the cover and base layers 151, 152. In addition to FR-4, other exemplary materials include polytetrafluoroethylene, FR-2 (phenolic cotton paper), FR-3 (cotton paper and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), and CEM-5 (woven glass and polyester).

Also shown in FIG. 5, the cable 110 includes insulation layers 234, 236 that surround the signal conductors 142, 144. The insulation layers 234, 236 may be removed to expose wire-terminating ends 238, 240 of the signal conductors 142, 144, respectively. In the illustrated embodiment, each of the insulation layers 234, 236 is completely removed from around the respective signal conductors 142, 144. In other embodiments, only a portion of the insulation layers 234, 236 is removed. The amount of insulation stripped from around the signal conductors 142, 144 may also be selected to control the impedance.

Also shown in FIG. 5, the circuit board 122 may include ground vias 242, 244. The ground vias 242, 244 may extend through the base and cover layers 152, 151 (FIG. 3) and electrically couple at least the first and second ground planes 161, 162. In the illustrated embodiment, each of the ground vias 242, 244 extends entirely through the circuit board 122 and electrically couples the ground planes 161-164. However, in alternative embodiments, the ground vias 242, 244 may not extend entirely through. For example some ground vias may extend through the cover and base layers 151, 152 to electrically couple the ground planes 161, 162, and other ground vias may extend through the substrate layers 153, 154 to electrically couple the second, third, and fourth ground planes 162-164.

Figure 6:
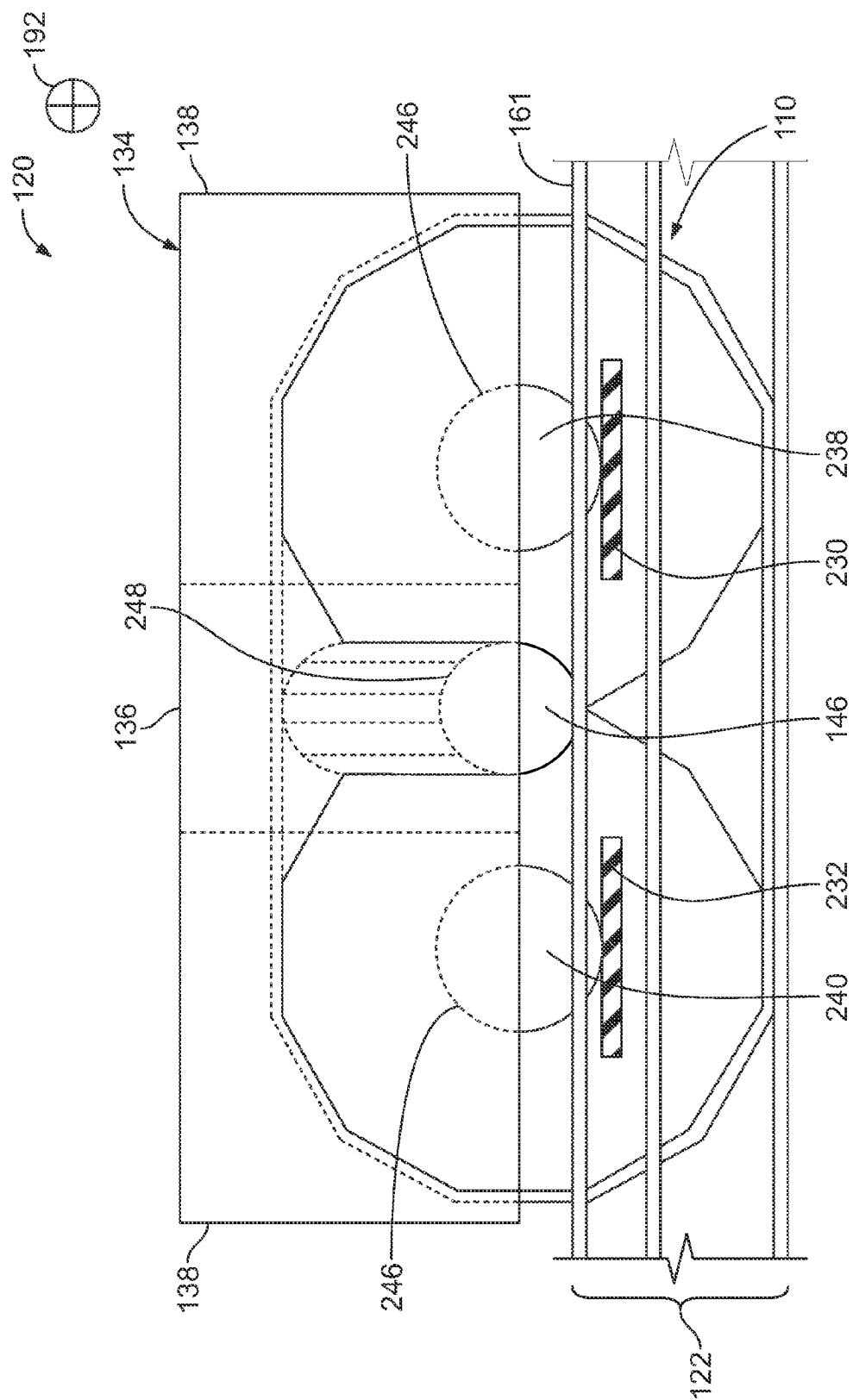
FIG. 6 illustrates the front view of FIG. 4 in which a compression component is mounted onto the communication cable.

FIG. 6 is a view along the longitudinal axis 192 showing the compression component 134 mounted onto the conductive elements of the cable 110 and the circuit board 122. For illustrative purposes, the substrate layers 151-154 (FIG. 3) are not shown in FIG. 6. As shown, each of the leg elements 138 has a recess 246, and the bridge element 136 has a recess 248. The recesses 246 are dimensioned relative to dimensions of the wire-terminating ends 238, 240, and the recess 248 is dimensioned relative to the dimension of the drain wire 146. When the compression component 134 is mounted onto the connector assembly 120, the wire-terminating ends 238, 240 and the drain wire 146 are received within the respective recesses 246, 248 and pressed toward the circuit board 122. More specifically, the drain wire 146 is pressed against the first ground plane 161 and the wire-terminating ends 238, 240 are pressed against the terminal pads 230, 232. In the illustrated embodiment, the terminations are solderless terminations. However, in alternative embodiments, a soldering process may be subsequently applied to join the conductive elements of the cable 110 to the conductive elements of the circuit board 122.

During operation, the compression component 134 has a fixed position with respect to the circuit board 122. However, in an exemplary embodiment, the compression component is configured to removably engage the conductors and/or drain wire of the cable 110. For example, the compression component 134 may be movable with respect to the circuit board 122 and/or the module housing 114 (FIG. 1) during assembly so that the cable 110 may be coupled to the circuit board 122. In some embodiments, the compression component 134 is coupled to an actuator that presses the compression component 134 toward the circuit board 122. In some embodiments, the compression component 134 is removably attached to the module housing 114.

The compression component 134 can also include an integrated shield (not shown). For example, the integrated shield can extend over the wire-terminating ends 238, 240 and the drain wire 146 when the compression component 134 is mounted onto the conductive elements of the cable 110 and the circuit board 122. The integrated shield may be used to control impedance at the mating interface and/or reduce electromagnetic interference. In particular embodiments, the integrated shield may operate as an extension of the shielding 140 (FIG. 3). For example, the integrated shield may be shaped similarly to a top portion of the shielding 140 as shown in FIG. 3. The integrated shield may be a thin, shaped layer of conductive material. When the compression component 134 is mounted, the integrated shield may be electrically coupled to and extend away from the shielding 140 along the longitudinal axis 192. Dielectric material of the compression component 134 may exist between the integrated shield and the wire-terminating ends 238, 240 and the drain wire 146. The integrated shield may have other configurations.

Figure 7:
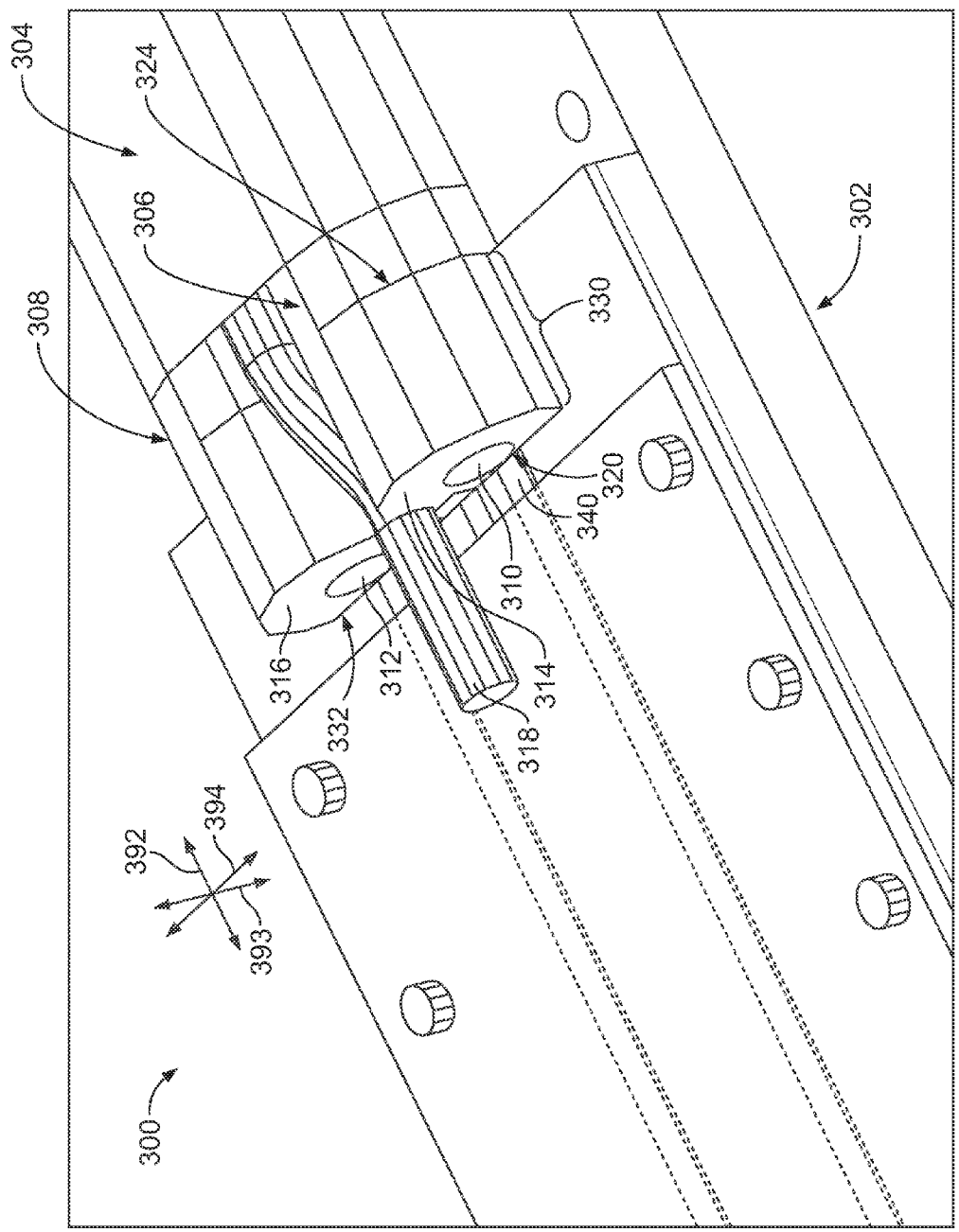
FIG. 7 is a perspective view of an electrical connector assembly formed in accordance with one embodiment.

FIG. 7 is a perspective of an electrical connector assembly 300 formed in accordance with one embodiment. The connector assembly 300 may include a printed circuit board 302 and a compression component (not shown) that is similar to the compression component 134 (FIG. 2) or the alternatives described above. The connector assembly 300 is oriented with respect to mutually perpendicular axes 392-394 including a longitudinal axis 392. The circuit board 302 may be similar to the circuit board 122 (FIG. 1). As shown, the connector assembly 300 may also include a communication cable 304 having cable wires 306, 308. Each of the cable wires 306, 308 includes a signal conductor 310, 312, respectively, and an insulation layer 314, 316 that surrounds the corresponding signal conductor. The cable 304 also has a drain wire 318. In the illustrated embodiment, the cable 304 has a parallel pair construction that is similar to the construction of the cable 110 (FIG. 1).

One manner of controlling impedance includes modifying an amount of insulation that exists around the signal conductors 310, 312. With respect to the cable wire 306, the insulation layer 314 includes a stripped portion 330 in which the insulation layer 314 is removed from the cable wire 306. The stripped portion 330 extends from a distal end 320 of the cable wire 306 to an endpoint 324. The signal conductor 310 is exposed along the stripped portion 330 in a direction along the longitudinal axis 392. The exposed area of the signal conductor 310 is permitted to electrically connect with the circuit board 302. More specifically, the signal conductor 310 may engage a signal trace 340 of the circuit board 302. When the cable wire 306 is mounted onto the circuit board 302, the exposed area of the signal conductor 310 contacts the signal trace 340 and the remainder of the signal conductor 310 may be substantially surrounded by the insulation layer 314. The cable wire 308 may include a similar stripped portion 332.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
a printed circuit board including base and cover layers of dielectric material and first and second ground planes of conductive material, the base and cover layers being stacked relative to each other and located between the first and second ground planes, the base layer having a conductor-receiving portion that extends beyond the cover layer, the circuit board also including signal traces that are exposed to an open space that exists above the conductor-receiving portion;
a compression component configured to be positioned in the open space to press wire-terminating ends of signal conductors onto the signal traces at the conductor-receiving portiond; and
a module housing having a housing cavity, the circuit board being located at least partially in the housing cavity, wherein the circuit board, the compression component, and the module housing form a pluggable electronic module, the conductor-receiving portion being located within the housing cavity.

2. The connector assembly of claim 1, wherein the cover layer includes a cover edge and the base layer includes a base edge along the conductor-receiving portion, the connector assembly further comprising a third ground plane that extends beyond the cover and base edges.

3. The connector assembly of claim 1, wherein the circuit board includes ground vias that extend through the base and cover layers and electrically couple the first and second ground planes.

4. The connector assembly of claim 1, wherein the compression component is configured to be secured in a fixed position with respect to the circuit board.

5. The connector assembly of claim 1, wherein the first ground plane is coupled to the cover layer and at least partially exposed to the open space.

6. The connector assembly of claim 1, wherein the conductor-receiving portion extends away from the cover layer along a longitudinal axis, and wherein the signal traces include path portions and terminal pads, the terminal pads and the path portions having differently sized cross-sections taken perpendicular to the longitudinal axis.

7. The connector assembly of claim 1, wherein the circuit board includes terminal contacts located proximate to the mating end, the terminal contacts configured to communicatively couple to an electrical component.

8. The electrical connector assembly of claim 1, further comprising a communication cable having the signal conductors and insulation layers that each surround one of signal conductors, the insulation layers having partially stripped portions in which the corresponding signal conductor has an exposed area along a length of the corresponding signal conductor and a covered area along the same length of the corresponding signal conductor, the exposed areas configured to engage the signal traces at the conductor-receiving portion.

9. An electrical connector assembly comprising:
a printed circuit board including base and cover layers of dielectric material and first and second ground planes of conductive material, the base and cover layers being stacked relative to each other and located between the first and second ground planes, the base layer having a conductor-receiving portion that extends beyond the cover layer, the circuit board also including signal traces that are exposed to an open space that exists above the conductor-receiving portion;
a communication cable including an insulative jacket and signal wire conductors that are surrounded by the insulative jacket, the signal wire conductors having exposed wire-terminating ends; and
a compression component positioned in the open space and pressing the wire-terminating ends of the signal wire conductors onto the signal traces at the conductor-receiving portion.

10. The connector assembly of claim 9, wherein the cable includes a conductive shielding that surrounds the signal wire conductors.

11. The connector assembly of claim 10, wherein the base layer includes a base edge along the conductor-receiving portion, the connector assembly further comprising a third ground plane that extends beyond the base edge, the shielding being directly coupled to the third ground plane.

12. The connector assembly of claim 9, wherein the open space extends along the first ground plane and the cable includes a drain wire, the drain wire being directly coupled to the first ground plane.

13. The connector assembly of claim 9, wherein the cable includes a pair of the signal wire conductors and a drain wire that have a parallel pair or twisted pair construction, the drain wire being directly coupled to the first ground plane.

14. The connector assembly of claim 9, wherein the signal wire conductors and the signal traces form solderless terminations.

15. The connector assembly of claim 9, further comprising a module housing having a housing cavity, the circuit board being located at least partially in the housing cavity, wherein the circuit board, the compression component, and the module housing form a pluggable electronic module that has a mating end and a cable end, the conductor-receiving portion being located proximate to the cable end.

16. The connector assembly of claim 15, wherein the circuit board includes terminal contacts located proximate to the mating end, the terminal contacts configured to communicatively couple to an electrical component.

17. A printed circuit board configured to directly couple to signal conductors of a communication cable, the circuit board comprising:
a dielectric base layer having a body portion, a conductor-receiving portion, and a layer surface that extends along the body and conductor-receiving portions, the conductor-receiving portion having a base edge of the base layer;
a dielectric cover layer having a cover edge, the cover layer being stacked onto the layer surface of the body portion, the conductor-receiving portion of the base layer extending from the cover edge to the base edge;
first and second ground planes spaced apart from each other with the base and cover layers located therebetween;
signal traces located on the layer surface of the conductor-receiving portion, wherein the signal traces are exposed to an open space along the layer surface of the conductor-receiving portion to directly couple with the signal conductors of the communication cable; and
a third ground plane extending beyond the base edge such that the third ground plane is exposed to the open space, the third ground plane having an open area sized to directly couple to a conductive shielding of the communication cable.

18. The circuit board of claim 17, further comprising ground vias that extend through the base and cover layers and electrically couple the first and second ground planes.

19. The circuit board of claim 17, wherein the conductor-receiving portion extends away from the cover layer along a longitudinal axis, and wherein the signal traces include path portions and terminal pads, the terminal pads and the path portions having differently sized cross-sections taken perpendicular to the longitudinal axis, the terminal pads configured to directly couple with the signal conductors of the communication cable.

20. The circuit board of claim 17, further comprising the communication cable having the signal conductors and the conductive shielding.

* * * * *